(12) United States Patent
Nussupov

(10) Patent No.: US 6,414,328 B1
(45) Date of Patent: Jul. 2, 2002

(54) METHOD AND APPARATUS FOR THE CONVEYING AND POSITIONING OF ION IMPLANTATION TARGETS

(76) Inventor: Kair Nussupov, P.O. Box 197, 3089 Brighton 6 St., Brooklyn, NY (US) 11235

( * ) Notice: Subject to any disclaimer, the term of this patent is extended or adjusted under 35 U.S.C. 154(b) by 0 days.

(21) Appl. No.: 09/434,373

(22) Filed: Nov. 5, 1999

(51) Int. Cl.[7] ............................................. H01J 37/317
(52) U.S. Cl. ............................. 250/492.21; 250/492.2
(58) Field of Search .......................... 250/492.21, 492.3, 250/492.2

(56) References Cited

U.S. PATENT DOCUMENTS

| | | | |
|---|---|---|---|
| 4,568,234 A | 2/1986 | Lee et al. | 414/404 |
| 4,818,326 A * | 4/1989 | Liu et al. | 156/345 |
| 4,928,016 A | 5/1990 | Mori et al. | 250/440.1 |
| 4,948,979 A | 8/1990 | Munakata et al. | 250/492.2 |
| 4,975,586 A | 12/1990 | Ray | 250/492.2 |
| 5,124,557 A | 6/1992 | Aitken | 250/442.11 |
| 5,389,793 A * | 2/1995 | Aitken et al. | 250/492.21 |
| 6,002,109 A * | 12/1999 | Johnsgard et al. | 219/390 |

FOREIGN PATENT DOCUMENTS

| | | |
|---|---|---|
| GB | 2196176 | 4/1988 |
| JP | 2-79350 | 3/1990 |

* cited by examiner

Primary Examiner—John R. Lee
Assistant Examiner—Anthony Quash
(74) Attorney, Agent, or Firm—Richard C. Litman

(57) ABSTRACT

An economical, high capacity, multi-chamber target presentation unit is used in the ion beam processing of semiconductor wafers in the fabrication of integrated circuits. The multi-chamber target presentation unit comprises a central vacuum chamber where the semiconductor wafers are processed and two symmetrically disposed lateral vacuum chambers wherein one of the lateral vacuum chambers is the loading chamber into which the semiconductor wafers which are mounted on cassettes are loaded, while the other lateral vacuum chamber is the discharge chamber into which the semiconductor wafers are transferred after processing. The cassettes with mounted wafers are conveyed from one vacuum chamber to another by means of several screw conveyors and a looped chain conveyor. The present invention continuously processes large semiconductor wafers both efficiently and economically. The present invention has a large capacity and a high throughput being able to continuously process a large number of semiconductor wafers in a relatively short period of time.

16 Claims, 13 Drawing Sheets

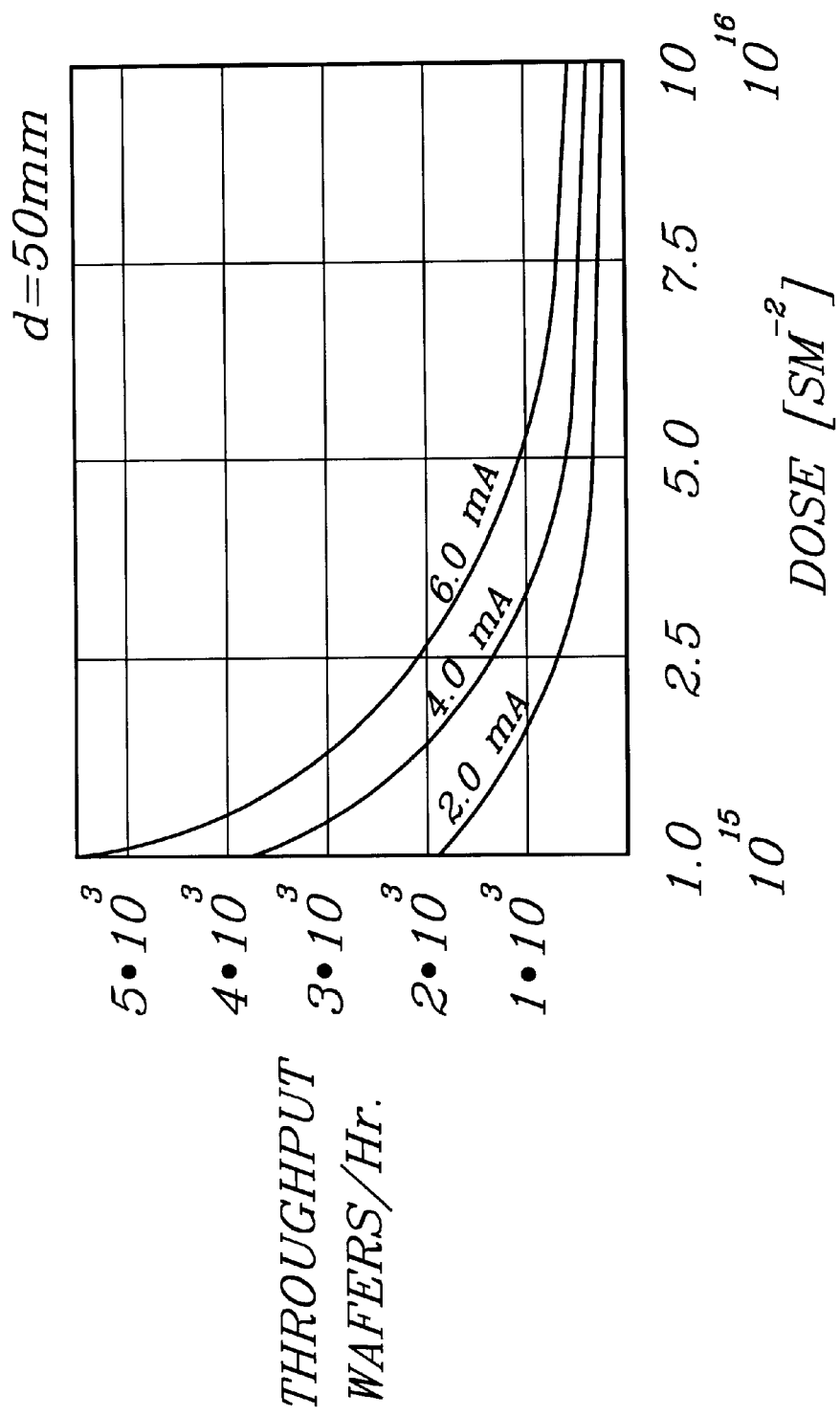

METHOD AND APPARATUS FOR THE CONVEYING AND POSITIONING OF ION IMPLANTATION TARGETS

BACKGROUND OF THE INVENTION

1. Field of the Invention

The present invention relates to the process of ion implantation, and particularly to an apparatus and method for implanting ions of different elements into metal, quartz, and semiconductor wafers ranging in diameter from 76 mm to 450 mm in the fabrication of very large scale integrated circuits. The apparatus and method of the present invention provides for the very high efficiency large scale manufacture of various types of semiconductor devices such as solar cells and integrated circuits and for the surface modification of metal and dielectric wafer surfaces.

2. Description of the Related Art

Ion implantation plays an essential role in the synthesis of thin films, the epitaxial growth of thin films, and the manufacturing of semiconductor devices. Ion implantation makes it possible to synthesize high quality thin films, to grow high quality thin films, and to manufacture semiconductor devices with a very high degree of precision and accuracy, and with high yields. Ion implantation equipment typically consists of an ion implanter and an end station or target unit that houses the articles to be processed. Ion implantation is achieved either by beam scanning of the target, which involves the electrostatic or magnetic movement of the beam across the target, or mechanical scanning of the target, which involves moving the target through the beam.

Mechanical scanning of the target through the beam results in a more uniform implanting of the target than does beam scanning across the target; therefore, mechanical scanning is the preferred technique. The implantation ions of the ion beam are mass-selected using a magnet housed in the ion implanter. Mass selection of the implanted ions enables the implantation of specific ionic species. For example, $C^+$ ions are mass-selected from the other ionic species present in the ionized source gas used to obtain $C^+$ ions for implantation into the target element.

The present invention is a method and an apparatus for automatically handling wafers having different configurations, such as silicon wafers, silicon dioxide wafers, metal wafers, other dielectric wafers and other semiconductor wafers. These wafers are commonly referred to as substrates.

Ion beam processing of substrates having diameters larger than 150–200 mm is cumbersome, inefficient, and expensive. There are a number of problems associated with the ion beam processing of substrates, particularly silicon substrates, using conventional ion beam processing equipment. For example, the quality of thin films synthesized using either ion beam deposition or ion beam epitaxy is considerably better when the synthesis occurs at temperatures higher than room temperature. On the other hand, the manufacture of semiconductor devices and integrated circuits require ion beams having values in the range of hundreds of microamperes to a few milliamperes.

Ion implantation is used in semiconductor device manufacturing to introduce dopants into a semiconductor substrate; for example, a silicon substrate, to alter the conductivity of portions of the semiconductor substrate. Ion beams having those magnitudes of currents require accelerating voltages in the range of 200–300 keV. However, at such high magnitudes of ion beam current and accelerating voltage, heating of the silicon substrate, which is extremely undesirable, is unavoidable and inevitable.

The present invention utilizes a spiral graphite heater to heat the silicon substrates during the ion beam deposition or the ion beam growth of thin films and a cooling means to remove heat generated during the ion beam fabrication of integrated circuits. Presently, the primary commercial use of ion implantation is in the manufacture of large scale integrated circuits (LSIC) chips. Implanting conductivity modifying chemical impurities into semiconductor wafers is a significant part of the process for manufacturing semiconductor devices such as large scale integrated circuit chips.

The density of integrated circuits and their speed of operation are very dependent upon tight control of the profile of doped regions in a wafer, that is, regions to which substantial concentrations of conductivity modifying impurities have been added. The tight control of wafer doping is best achieved using ion implantation techniques and equipment. Ion implantation doping methods result in improved very large scale integration (VLSI) by making more efficient use of the wafer area, shortening interconnects between devices, producing smaller geometries, and reducing noise.

Ion implantation is the doping process of choice because of the kinds of doping profiles, concentrations, and lateral geometries required on a VLSIC wafer. Only ion implantation is capable of providing the uniformity of doping that is critical in the fabrication of smaller geometry devices. Furthermore, doping uniformity across the wafer and repeatability from wafer to wafer, which is achievable with ion implantation, dramatically improves fabrication yields of high density devices.

Silicon ingots of diameters up to 300 mm are now available; however, most conventional ion implantation equipment is designed to accommodate substrates, that are cut from an ingot, of substantially smaller diameter (150 mm or less). The processing of substrates with diameters in excess of 150 mm by conventional ion implantation equipment requires costly modifications of the equipment.

The mechanical scanning cylindrical carousel apparatus can accommodate substrates with diameters in excess of 150 mm; however, the carousel apparatus has a low capacity being able to accommodate no more than 50 substrates with diameters of 300 mm, which results in a low throughput. The widely used spinning disc apparatus requires substrates with diameters in excess of 250 mm to have the same capacity as the cylindrical carousel apparatus; however, the spinning disc apparatus is not able to accommodate substrates with such a large diameter. In addition, scanning errors arise as a result of the radial translation of the discs (substrates) through the ion beam which results in dose nonuniformity in the radial direction.

The ion implantation apparatus of the present invention readily accommodates substrates with diameters in excess of 150 mm; therefore, a high degree of integration in the fabrication of integrated circuits is possible which results in a reduction in the cost of fabricating the integrated circuits. The present invention is capable of accommodating a large number of substrates with diameters in excess of 150 mm resulting in a method and apparatus with a high throughput and an excellent yield. The prior art does not describe any method or apparatus with the capabilities of the present invention.

U.S. Pat. No. 4,975,586 issued on Dec. 4, 1990 to Andrew M. Ray describes the end station of an ion implantation apparatus that includes a rotatable wafer support. The wafer being processed is rotated during and between implants;

therefore, the wafers are implanted at variable implant angles. The wafer support is mounted on a first housing which is supported for rotation by a hub assembly extending through the wall of the end station vacuum chamber and is driven by a stepper motor through a drive belt and sheave system.

Rotation of the support about its own axis is provided by a stepper motor mounted on the rotating housing and connected to the wafer support by means of a drive system within the housing such that the two drive systems are operable independently of each other. The ion implantation apparatus of the Ray patent has a low throughput and a low capacity because the processing chamber can only accommodate a single wafer.

U.S. Pat. No. 4,948,979 issued on Aug. 14, 1990 to Yasao Munakata et al. describes a vacuum device that consists of a vacuum working chamber, a vacuum prechamber, and a communicating member that connects the vacuum working chamber and the vacuum prechamber. The communicating member is an independent member that is inserted between both vacuum chambers when needed. The vacuum working chamber contains an electronic gun for processing a substrate disposed in the vacuum chamber. The electronic gun emits an energy beam to form a descriptive pattern on the surface of the substrate.

The Munakata et al. patent describes a method of processing a substrate wherein the substrate to be processed is initially placed in the prechamber. The prechamber undergoes a vacuum pumpdown to evacuate the prechamber while the vacuum condition of the working chamber is maintained. The substrate is then transferred from the prechamber to the working chamber through the communication member without breaking vacuum conditions.

The substrate is then processed using the energy beam from the electronic gun. After processing is completed, the substrate is removed from the working chamber and returned to the prechamber through the communication member. The. vacuum condition of the prechamber is then released and the substrate is removed from the prechamber when the interior of the prechamber reaches atmospheric condition.

The method and vacuum apparatus of the Munakata et al. patent pertains to electron beam processing of a substrate which is conventionally used to pattern a resist coated on the surface of an underlying substrate and not to ion implantation. The method and apparatus of the Munakata et al. patent has a high turn-around time compared to the present invention because the working chamber and the prechamber are separate and must be repeatedly connected and disconnected. In addition, the method and apparatus described by the Munakata et al. patent has a low throughput because the vacuum apparatus of the Munakata el al patent processes only one substrate at a time.

A method and apparatus for ion implanting semiconductors using an apparatus that comprises a support rotor for carrying the target wafers on support bases mounted on arms extending radially from a core structure of the rotor is described in U.S. Pat. No. 5,124,557 issued on Jun. 23, 1992 to Derek Aitken. The apparatus of the Aitken patent comprises a support rotor comprising a central core structure or hub, numerous support bases arranged in a circular configuration around the hub with each support base being mounted on a radial support arm. The support rotor is mounted for rotation on an axle and rotated about an axis by a spin motor which in turn is mounted on a shaft. The target wafers are rotated by the rotor through the ion beam to produce scanning across the target wafers.

None of the above inventions and patents, taken either singly or in combination, is seen to describe the instant invention as claimed. Thus, an economical, high capacity target presentation unit for the ion beam processing of large semiconductor substrates that solves the aforementioned problems is desired.

SUMMARY OF THE INVENTION

Accordingly, it is a principal object of the invention to provide a method and apparatus for the ion implantation processing of semiconductor substrates that has a high throughput, a high density of integration, and a high yield.

It is another object of the invention to provide a provide an ion implantation processing apparatus that has an economical, compact design that is both operationally efficient and cost effective.

It is a further object of the invention to provide a method and apparatus that optimizes the deposition of thin films and the ion implantation of semiconductor wafers.

Still another object of the invention is to provide a method and apparatus that prevents the detrimental effects due to unwanted heating that occurs during implantation.

It is an object of the invention to provide improved elements and arrangements thereof for the purposes described which is inexpensive, dependable and fully effective in accomplishing its intended purposes.

To meet the above objectives, the present invention provides a method and apparatus that comprises processing substrates in a multi-chamber apparatus. The multi-chamber apparatus comprises a central vacuum chamber where the substrates are processed and two symmetrically disposed lateral vacuum chambers. One of the lateral vacuum chambers is the loading chamber into which the substrates mounted on cassettes are loaded, whereas the second lateral vacuum chamber is the discharge chamber into which the substrates are transferred after processing.

The cassettes with mounted substrates are conveyed from one vacuum chamber to another by means of several screw conveyors and a looped chain conveyor. The screw conveyors advance the cassettes forward in the loading chamber and in the discharge chamber. The cassettes are advanced in the implantation chamber by means of a looped chain conveyor that moves the cassettes in a direction that is perpendicular to the direction of movement of the cassettes in the loading and discharge chambers.

The present invention processes large silicon and quartz plates both efficiently and economically. The present invention has a large capacity and a high throughput being able to process a large number of silicon or quartz plates in a relatively short period of time. The compact design of the present invention results in much lower costs both in the cost of materials to manufacture the present invention, and in the cost of operating and maintaining the present invention.

The present invention makes use of directing rods disposed within the loading and discharge chambers to transport and guide the silicon or quartz plates mounted on the cassettes through the loading and discharge chambers, and a pair of runners disposed within the processing chamber to guide the silicon or quartz plates through the processing chamber; that is, the silicon or quartz plates are moved from the loading chamber to the processing chamber to the discharge chamber in a continuous manner. At no time after the silicon or quartz plates are loaded into the loading chamber and transported between the loading, implantation, and discharge chambers of the present invention is vacuum ever broken; therefore, the silicon or quartz plates are completely processed using a single vacuum pumpdown.

The implantation chamber of the present invention has a spiral graphite heater that is used to heat the substrates to the appropriate deposition temperature when the multi-chamber apparatus of the present invention is used to deposit thin films using the process of ion beam deposition, for example, a diamond-like carbon film. The implantation chamber of the present invention also has a cooler to cool the substrates during ion beam implantation to prevent the detrimental effects to integrated circuit performance due to unwanted diffusions caused by the heating of the substrates during the ion implantation process.

The ingenious simplicity and straightforwardness of the method of the present invention and the economy of design of the target presentation apparatus of the present invention result in increased productivity at reduced cost.

These and other objects of the present invention will become readily apparent upon further review of the following specification and drawings.

BRIEF DESCRIPTION OF THE DRAWINGS

FIGS. 7A–7D are graphs showing the throughput capabilities of the target presentation unit for wafers of different diameter.

Similar reference characters denote corresponding features consistently throughout the attached drawings.

DETAILED DESCRIPTION OF THE PREFERRED EMBODIMENTS

Figure 1:
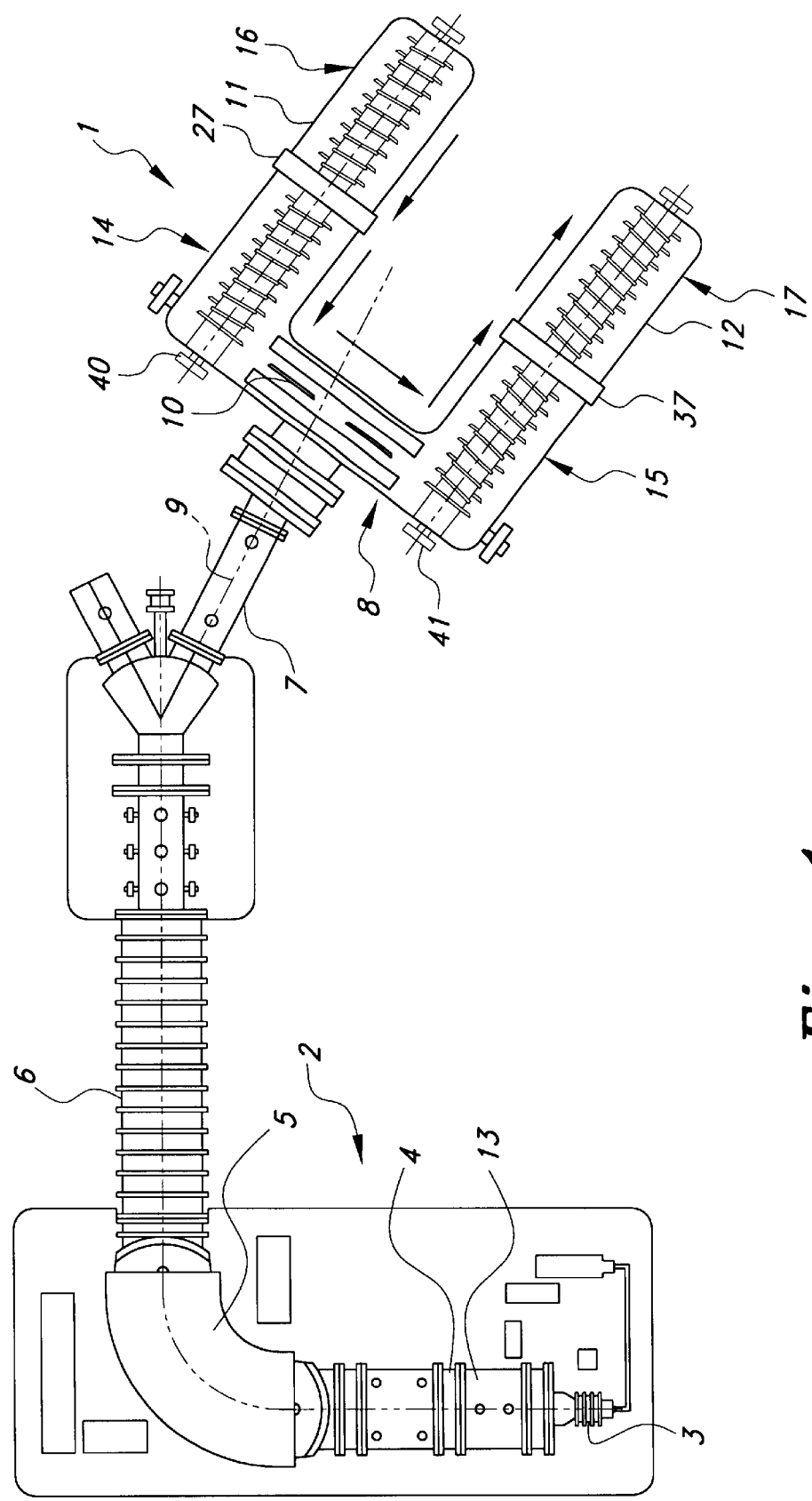
FIG. 1 is a diagrammatic, top view of the target presentation unit connected to an ion implantation apparatus according to the present invention.

Referring to FIG. 1 which shows a preferred embodiment of the target presentation unit 1 of the present invention, the target presentation unit 1 is shown connected to an ion implantation apparatus 2. The ion implantation apparatus 2 comprises an ion source 3 with an extractor and lens 13 for generating an ion beam, a Faraday cup with vacuum valve 4 for measuring the magnitude of the beam current, an analyzing magnet 5 for the mass selection of the required ion species, an acceleration stage 6, and a magnetic scanning system 7. The ion implanter 2 generates the ion beam 9 that enters the processing chamber 8 of the target presentation unit 1 where the ion beam 9 is used to process the semiconductor wafers 10 as the wafers 10 are conveyed past the ion beam 9 (mechanical scanning).

Figure 4:
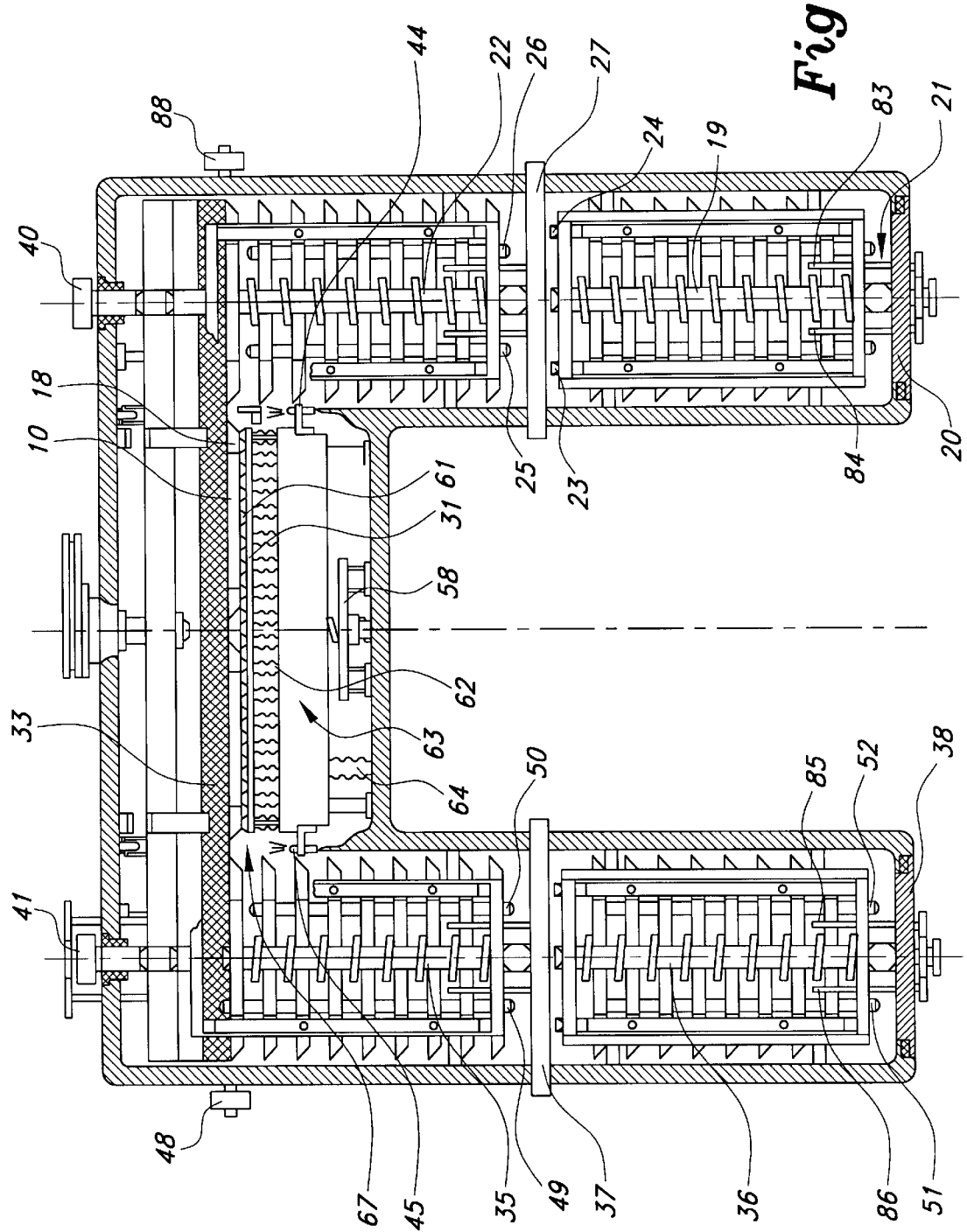
FIG. 4 is a top view of the target presentation unit with the top cover of the target presentation unit removed.

The target presentation unit 1 comprises a central processing chamber 8, a loading chamber 11, and a discharge chamber 12. Both the loading chamber 11 and the discharge chamber 12 are partitioned into an anterior section (14,15) and a posterior section (16,17). Referring to FIGS. 1 and 4, the doors (27,37) of the anterior sections (14,15) of the loading chamber 11 and the discharge chamber 12 are opened. A first set of semiconductor wafers 10 mounted on cassettes 18 are loaded onto the screw conveyor 19 of the posterior section 16 of the loading chamber 11 using the posterior chamber door 20. The screw conveyor 19 of the posterior section 16 of the loading chamber 11 is advanced using a docking means 21 disposed on the posterior chamber door 20 of the loading chamber 11 until the posterior section screw conveyor 19 docks with the screw conveyor 22 of the anterior section 14 of the loading chamber 11. The cassettes 18 carrying the semiconductor wafers 10 are transferred from the posterior section screw conveyor 19 to the screw conveyor 22 of the anterior section 14 by advancing the cassettes 18 forward and off of the directing rods (23,24) of the posterior section screw conveyor 19 and onto the directing rods (25,26) of the anterior section screw conveyor 22.

Once the transfer of the first set of semiconductor wafers 10 has been completed, the screw conveyors (19,22) of the anterior section 14 and the posterior section 16 of the loading chamber 11 are separated, the posterior screw conveyor 19 is reloaded with a second set of semiconductor wafer 10 bearing cassettes 18, and the anterior screw conveyor 22 and the posterior screw conveyor 19 are redocked which allows for. the transfer of cassettes 18 from the posterior screw conveyor 19 to the anterior screw conveyor 22 as cassettes 18 vacate the anterior screw conveyor 22 to enter. the processing chamber 8. Next, the anterior screw conveyor 35 and the posterior screw conveyor 36 of the discharge chamber 12 are docked. Now, both the anterior screw conveyor 22 and the posterior screw conveyor 19 of the loading chamber 11 are docked and fully loaded with semiconductor wafer 10 bearing cassettes 18 and the anterior screw conveyor 35 and the posterior screw conveyor 36 of the discharge chamber 12 are docked. The doors (20,38) of the posterior sections (16,17) of the loading chamber 11 and the discharge chamber 12 are closed. This constitutes the starting point of a process that results in the continuous processing of a large number of semiconductor wafers 10 using a single vacuum pumpdown of the processing chamber 8. Next, the processing chamber 8, the loading chamber 11, and the discharge chamber 12 are evacuated. Thus, the ion beam processing of the semiconductor wafers 10 in the target presentation unit 1 of the present invention does not require multiple vacuum pumpdowns of the processing chamber 8 but only a single vacuum pumpdown of the processing chamber 8. The processing chamber 8 is not exposed to the atmosphere until all processing is completed. Therefore, the formation of unwanted oxides with their detrimental effects is avoided.

Figure 2:
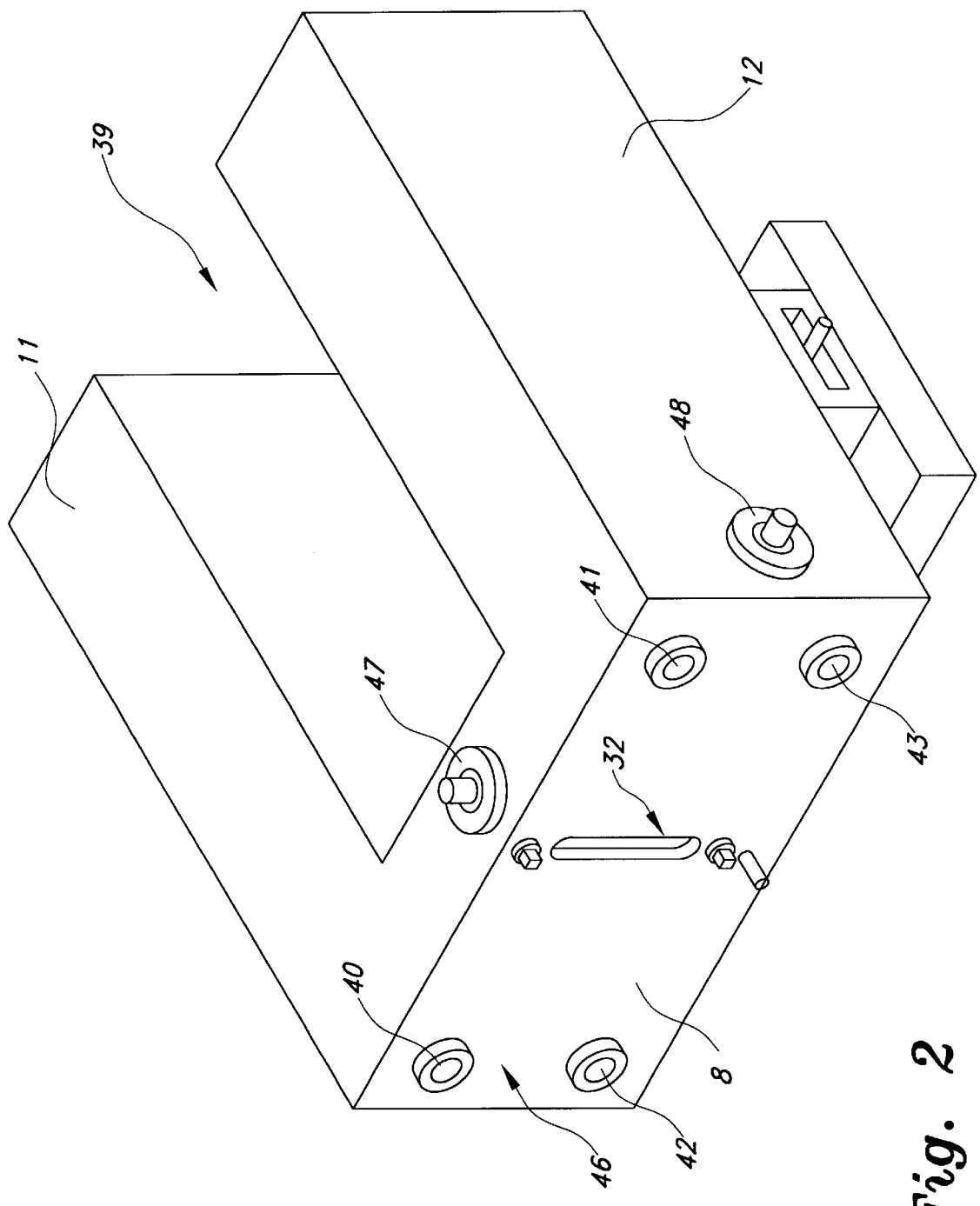
FIG. 2 is a perspective view of the external casing of the target presentation unit.
Figure 3:
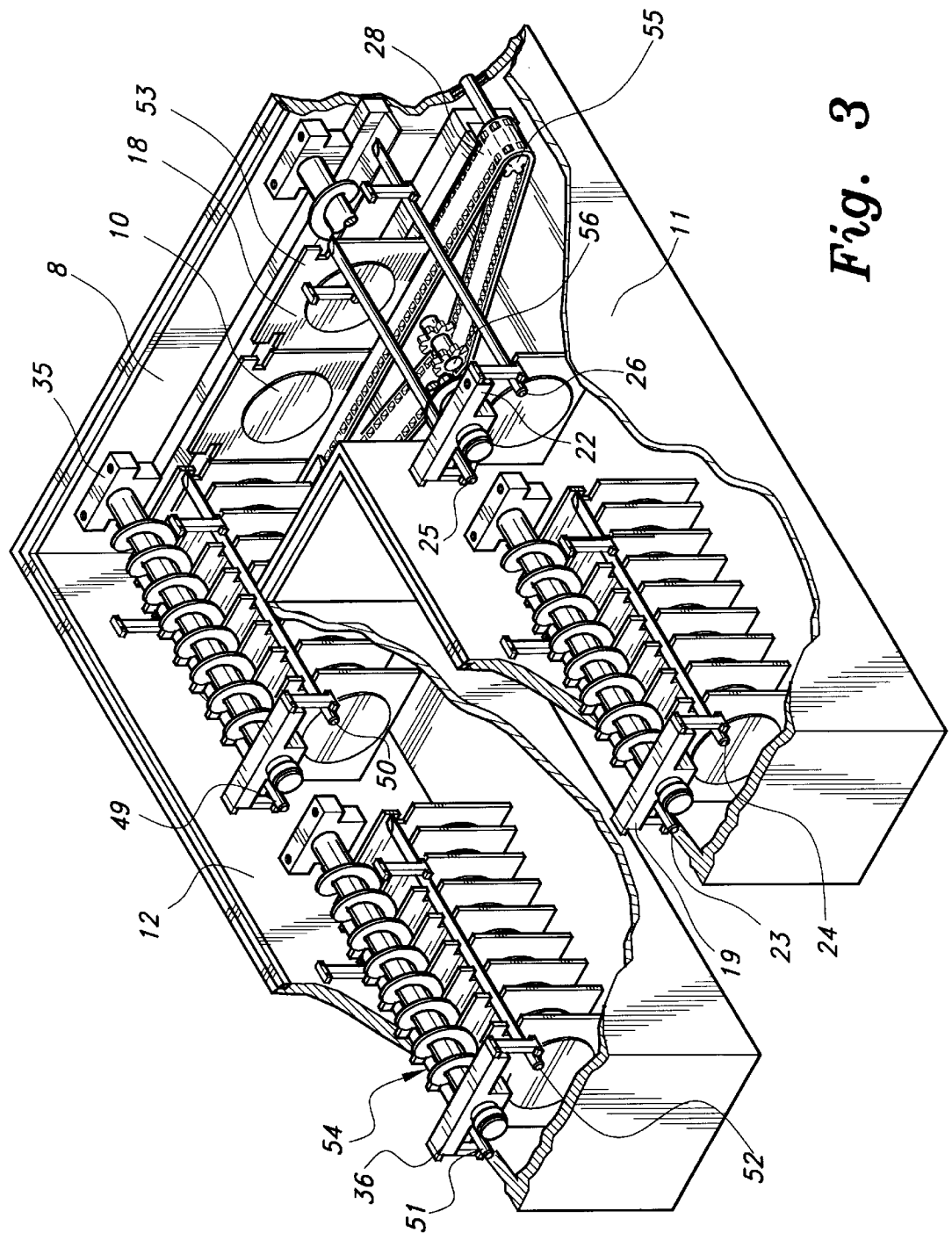
FIG. 3 is a perspective, cutaway view of the cassette conveying mechanisms of the target presentation unit.
Figure 6:
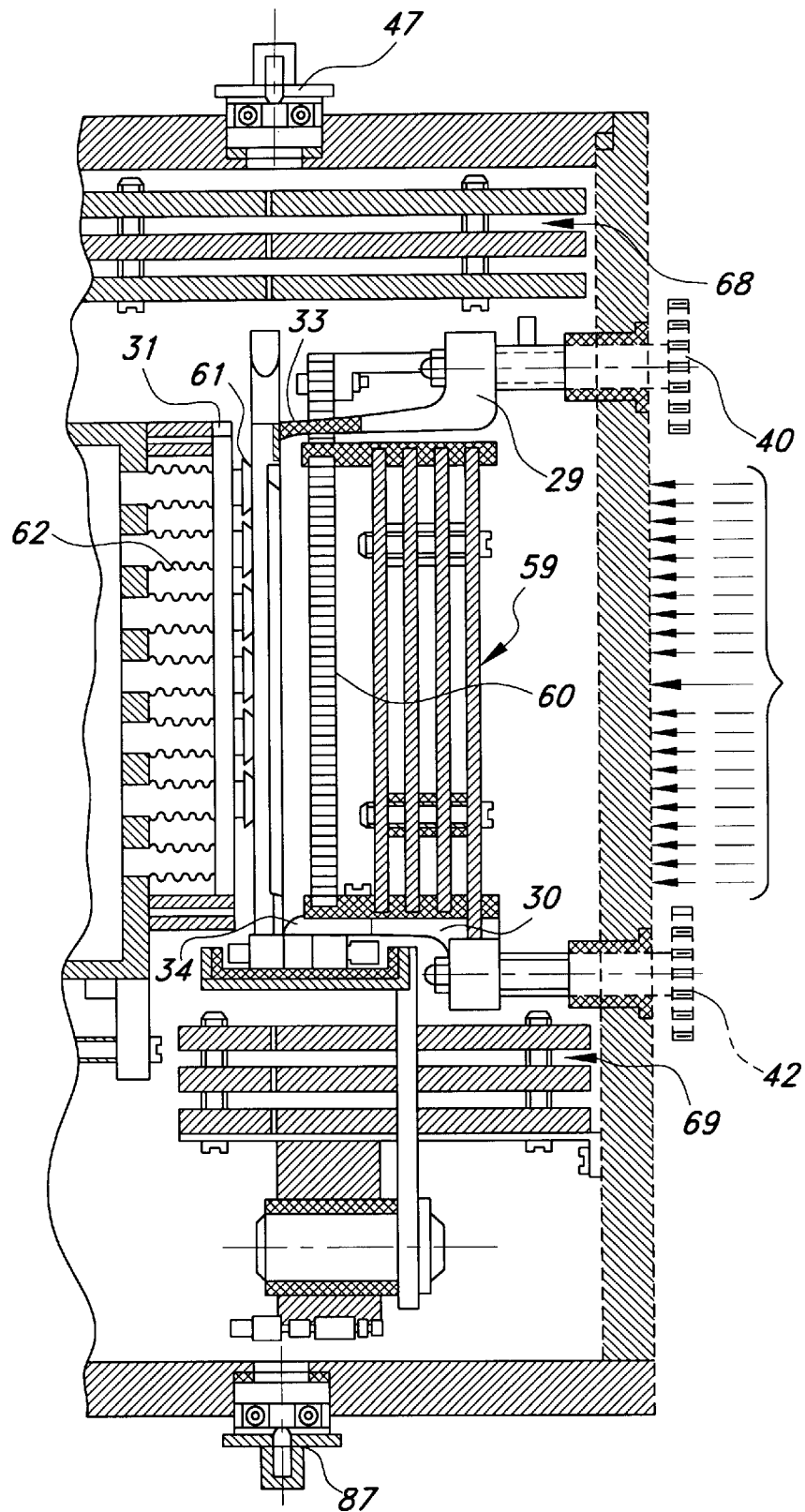
FIG. 6 is a side view of a cassette with wafer in the implantation chamber of the target presentation unit.

Referring to FIGS. 2, 3 and 6, the cassettes 18 are advanced along the screw conveyor 22 until a cassette 18 reaches the end of the screw conveyor 22 at which point the cassette 18 is transferred to the looped chain conveyor 28 of the implantation chamber 8. The transfer of a cassette 18 from the screw conveyor 22 of the loading chamber 11 to the looped chain conveyor 28 of the implantation chamber 8 involves a change in direction of 90 degrees by the cassette 18. As the cassettes 18 traverse the implantation chamber 8, the cassettes 18 are bounded in the front by upper and lower runners (29,30) and bounded in the rear by a cooling means 31, and the wafers 10 mounted on the cassettes 18 are processed as they pass the window 32 where the ion beam 9 enters the implantation chamber 8. Both the upper and the lower runners (29,30) of the implantation chamber 8 have ceramic caps (33,34) that electrically isolate the cassettes 18 from the runners (29,30). As the anterior screw conveyor 22 of the loading chamber 11 advances the first set of unprocessed wafers 10 forward and into the processing chamber 8, the posterior screw conveyor 19 of the loading chamber 8 advances the second set of unprocessed wafers 10 forward and onto the anterior screw conveyor 22 of the loading chamber 8.

Horizontal processing of the semiconductor wafers 10 is achieved using mechanical scanning of the wafers 10 which is accomplished by the horizontal motion of the wafers 10 along the implantation chamber 8. Vertical processing of the wafers 10 is achieved using beam scanning which is accomplished by the use of a magnet system 7 that is external to the target presentation unit 1 that moves the ion beam 9 up and down in the vertical direction along the surface of a wafer 10.

As the processed wafers 10 on their respective cassettes 18 reach the end of the implantation chamber 8, the cassettes 18 are transferred from the looped chain conveyor 28 of the implantation chamber 8 to the screw conveyor 35 of the anterior section 15 of the discharge chamber 12. The transfer of the cassettes 18 from the implantation chamber 8 to the discharge chamber 12 involves a second 90 degree change in direction of the cassettes 18. As the first set of processed wafers 10 are transferred from the looped chain conveyor 28 of the processing chamber 8 to the screw conveyor 35 of the anterior section 15 of the discharge chamber 12, the second set of unprocessed wafers 10 is transferred from the anterior screw conveyor 22 of the loading chamber 11 to the processing chamber 8.

When the second set of unprocessed wafers 10 is completely transferred from the posterior screw conveyor 19 of the loading chamber 11 to the anterior screw conveyor 22 of the loading chamber 11, the posterior screw conveyor 19 is undocked from the anterior screw conveyor 22 and the anterior section door 27 of the loading chamber is closed. The posterior section door 20 of the loading chamber 11 is opened and a third set of unprocessed wafer bearing cassettes 18 is loaded onto the posterior screw conveyor 19. Next, the posterior section door 20 is closed and the posterior section is evacuated. The anterior section door 27 is opened and the posterior screw conveyor 19 is docked with the anterior screw conveyor 22. Once the second set of unprocessed wafers 10 has vacated the anterior screw conveyor 22 of the loading chamber 11, the remaining portion of the third set of unprocessed wafers still on the posterior screw conveyor 19 of the loading chamber are rapidly advanced onto the anterior screw conveyor 22 to maintain the continuity of the process.

As the last cassette 18 of the first set of processed wafers 10 enters the anterior section 15 of the discharge chamber 12, the cassettes 18 bearing the first set of processed wafers 10 is rapidly advanced into the posterior section 17 of the discharge chamber 12. The anterior and posterior screw conveyors (35,36) of the discharge chamber 12 are separated and the anterior section door 37 of the discharge chamber 12 is closed. The door 38 of the posterior section 17 of the discharge chamber is opened which breaks the vacuum in the posterior section 17 and the cassettes bearing the first set of processed wafers 10 is unloaded.

The door 38 of the posterior section 17 of the discharge chamber 12 is closed and the air is evacuated from the posterior section 17. After the posterior section 17 is evacuated, the anterior section door 37 of the discharge chamber 12 is reopened and the anterior and posterior screw conveyors (35,36) of the discharge chamber 12 are redocked. Therefore, cassettes 18 bearing unprocessed wafers 10 are continuously loaded into the target presentation unit 1 while cassettes 18 bearing processed wafers 10 are continuously unloaded from the target presentation unit 1 without interrupting the flow of wafer bearing cassettes through the processing chamber 8. Thus, the continuous processing of wafers 10 using the target presentation unit 1 is performed for a sustained period of time by repeatedly loading and unloading cassettes 18. Consequently, a continuous processing technology is achieved using the target presentation unit 1 of the present invention.

Referring now to FIG. 2, which shows the external casing 39 that houses the internal components of the target presentation unit 1, the gearing mechanisms of the screw conveyors (19,22,35,36) and the looped chain conveyor 28 are interconnected to produce synchronous movement of the cassettes 18 through the chambers (8,11,12) of the target presentation unit 1. The gearing mechanisms of the target presentation unit 1 are driven by stepping motors (40,41) and linear motors (42,43). The speed of the cassette conveying mechanism of the target presentation unit 1 is controlled by optoelectronic sensors (44,45) (shown in FIG. 4). A pair of optoelectronic sensors (44,45) is located between the loading chamber 11 and the implantation chamber 8, and between the implantation chamber 8 and the discharge chamber 12. The optoelectronic sensors (44,45) register when a cassette 18 enters the implantation chamber 8 and when a cassette 18 leaves the implantation chamber 8.

The external casing 39 of the target presentation unit 1 has an elongated window 32 disposed in the center of the front panel 46 that serves as the point of entry of the ion beam 9. Disposed anteriorly on the top and bottom of the external casing and laterally on each side of the external casing 39 are positioning means (47,48) used to set the implantation angle which can be varied between plus or minus 15 degrees.

FIG. 3 is a cutaway, perspective view showing the conveying mechanism in each chamber of the target presentation unit 1. The screw conveyors (19,22,35,36) in conjunction with directing rods (23,24,25,26,49,50,51,52) convey the cassettes 18 through the loading and discharge chambers (11,12). The head portions 53 of the cassettes 18 fit into the grooves 54 of the helical screw conveyor (19,22,35,36). As the helical screw conveyor (19,22,35,36) rotates, the grooves 54 of the helical screw conveyor (19,22,35,36) advance which in turn advance the cassettes 18 along the directing rods (23,24,25,26,49,50,51,52). The looped chain conveyor 28 conveys the cassettes 18 through the implantation chamber 8. The looped chain conveyor 28 is kept in motion using a triple cogged wheel mechanism (55,56,57).

The directing rods (23,24,51,52) for the posterior section screw conveyors (19,36) of the loading and discharge chambers (11,12) are of equal length while the directing rods (25,26,49,50) for the anterior section screw conveyors (22, 35) are of different lengths. The outer directing rod (26,49) for the anterior section screw conveyors (22,35) is longer and extends all the way to the upper runner 29 of the implantation chamber 8 while the inner directing rod (25,50) is shorter and terminates at the beginning of the looped chain conveyor 28.

The difference in length between the outer (26,49) and inner (25,50) directing rods of the anterior section screw conveyors (22,35) allows the cassettes 18 to slide off of the screw conveyor 22 and onto the looped chain conveyor 28 when the cassettes 18 are conveyed from the loading chamber 11 to the implantation chamber 8, and to slide off the looped chain conveyor 28 and onto the screw conveyor 35 when the cassettes 18 are conveyed from the implantation chamber 8 to the discharge chamber 12. Thus, the target presentation unit 1 of the present invention provides a continuous conveying mechanism for the rapid and efficient transport of the semiconductor wafers 10.

The screw conveyors (19,36) of the posterior sections (16,17) of the loading and discharge chambers (11,12) are not in contact with the screw conveyors (22,35) of the anterior sections (14,15) when the target presentation unit 1 is in operation and the wafers 10 are being processed. The posterior section screw conveyor (19,36) and the anterior section screw conveyor (22,35) are only brought into contact using a docking means 21 when loading or unloading cassettes 18.

A top view of the target presentation unit 1 with the upper cover removed showing the spatial and functional relationships of the internal components of the target presentation unit 1 is depicted in FIG. 4. The target presentation unit 1 contains a Faraday cup 58 to measure the magnitude of the ion beam 9 current entering the unit 1. The ion beam 9 enters the target presentation unit 1 through an opening 32 in the center of the front wall 46 of the unit 1. The ion beam 9 passes through a small continuous opening in the electrode system 59, the spiral graphite heater 60, and the cooling means 31 until the ion beam 9 encounters the Faraday cup 58 disposed in the rear of the central chamber 8. An accurate measurement of ion beam 9 current magnitude is essential to the intricate processing required in very large scale integrated circuit fabrication because many other process parameters are determined or set based upon the amplitude of the beam current.

In the implantation chamber 8, the rear surfaces of the cassettes 18 are in contact with a cooling means 31. The cooling means 31 is used to transfer heat generated during the implantation process away from the wafer 10 undergoing processing. The cooling means 31 ensures that a desirable wafer 10 processing temperature is maintained. The cooling means 31 comprises copper plates 61 that are in direct contact with the rear surface of the wafer 10 bearing cassettes 18, phosphorus bronze spring bellows 62 that connect the copper plates 61 to the hollow body 63 of the cooling unit 31, and larger bellows 64 connecting the hollow body 63 of the cooling unit 31 to a suitable cooling agent. The contacting surface of the copper plates 61 can have a variety of shapes, for example, the contacting surface can be round, square, rectangular, or any suitable configuration.

The high heat conductivity of copper causes any heat generated as a result of implantation to be rapidly conducted away from the wafer 10 undergoing implantation. The implantation generated heat is conducted along the bellows (62,64) attached to the copper plates 61 to the hollow body 63 of the cooling unit 31. A substantial portion of the implantation generated heat is dissipated in the coolant vapor filled cavities of the cooling unit 31 with the major portion of the heat absorbed by the cooling agent. In a preferred embodiment, the cooling agent is either running cold water or liquid nitrogen because both running cold water and liquid nitrogen are inexpensive and environmentally safe. In an alternate embodiment, the copper plates 61 are attached to a spring having a pliable copper wire in the center of the spring (not shown) that extends from the copper plates 61 to the anterior surface of the hollow body 63 of the cooling unit 31. In this embodiment, heat is transmitted along the copper wire (not shown) to the hollow body 63 of the cooling unit 31.

In an alternate embodiment, the cooling means 31 is replaced with a second spiral graphite heater (not shown). The second spiral graphite heater is necessary when the required processing temperature cannot be obtained using a single heater, for example, the deposition of specific thin films require high deposition temperatures, typically 600–900 degrees centigrade. The cooling means 31 and the second heater can be interchanged with a minimum amount of effort.

Figure 5:
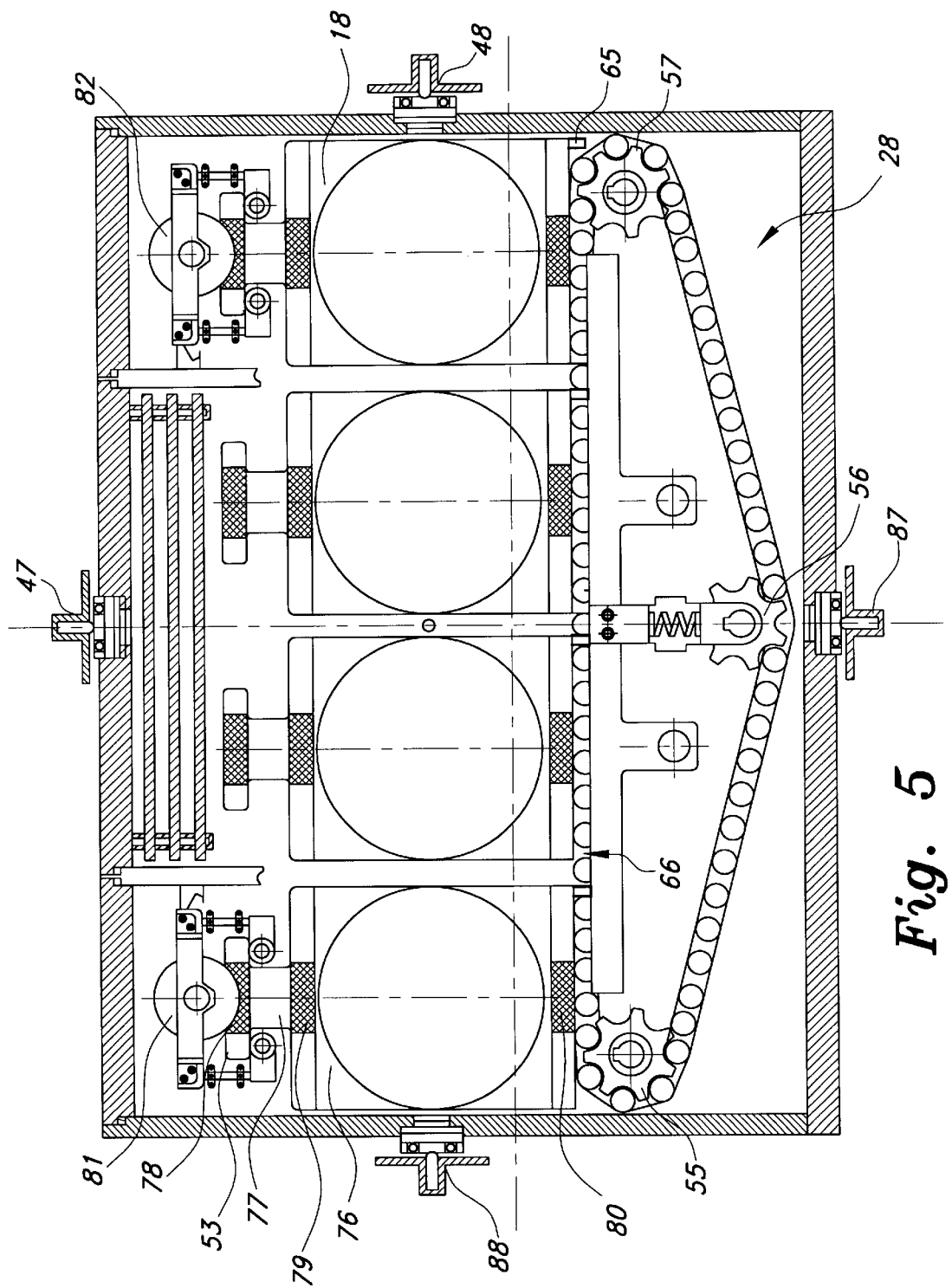
FIG. 5 is a partial front view of the cassette conveying mechanism for the implantation chamber of the target presentation unit.

FIG. 5 is a front view of the looped chain conveyor 28 of the central processing chamber 8 showing how the cassettes 18 with wafers 10 are conveyed and presented for processing (implantation or thin film formation). With reference to FIG. 5, a cassette 18 is advanced along the anterior section 14 of the lateral loading chamber 11 by the screw conveyor 22 until the cassette 18 encounters the runners (29,30) of the central processing chamber 8. The upper portion 53 of the cassette 18 that resides on top of the directing rods (25,26) of the screw conveyor 22 slides off of the directing rods (25,26) releasing the cassette 18 with wafer 10 into the central processing chamber 8.

Each cassette 18 has a small rectangular extension (protrusion) 65 located at the lower right corner of the cassette 18. When a cassette 18 reaches the runners (29,30) of the central processing chamber 8, the cassette protrusion 65 becomes seated in a sprocket 66 of the looped chain conveyor 28 and the cassette 18 with wafer 10 is transported by the looped chain conveyor 28 along the narrow passageway 67 of the central processing chamber 8. When the cassette 18 with wafer 10 has completely traversed the processing chamber 8, the cassette 18 reaches the opposite end of the looped chain conveyor 28 with the cassette protrusion 65 becoming unseated from the sprocket 66 of the looped chain conveyor 28, thus freeing the cassette 18 for transport into the discharge chamber 12. The upper portion 53 of the cassette 18 now resides on top of the directing rods (49,50) of the screw conveyor 35 of the anterior section 15 of the discharge chamber 12 and the cassette 18 with wafer 10 is conveyed away from the central processing chamber 8 and into the anterior section 15 of the discharge chamber 12.

FIG. 6 is a side view of a cassette 18 with wafer 10 in the central processing chamber 8. FIG. 6 shows the spatial relationship of the electrode system 59, the shielding system (68,69), the graphite heater 60, the cooling unit 31, the runners (29,30), and other internal components of the target presentation unit 1 of the present invention. Referring to FIG. 6, the electrode system 59 that produces a pure beam of ions 9 by eliminating unwanted electrons is disposed anterior to the graphite heater 60. The graphite heater 60 is disposed between the runners (29,30) of the chamber 8 with the graphite heater 60 forming the anterior boundary of the central processing passageway 67 where the wafers 10 are processed. In the preferred embodiment, a spiral graphite heater 60 is used, however, in an alternate embodiment, a flat graphite heater (not shown) is used. The cassette 18 with wafer 10 does not come into contact with the heater 60. The copper plates 61 of the cooling unit 31 form the posterior boundary of the central processing passageway 67 and the cassette 18 is in direct physical contact with the copper plates 61 of the cooling unit 31.

Figure 7B:
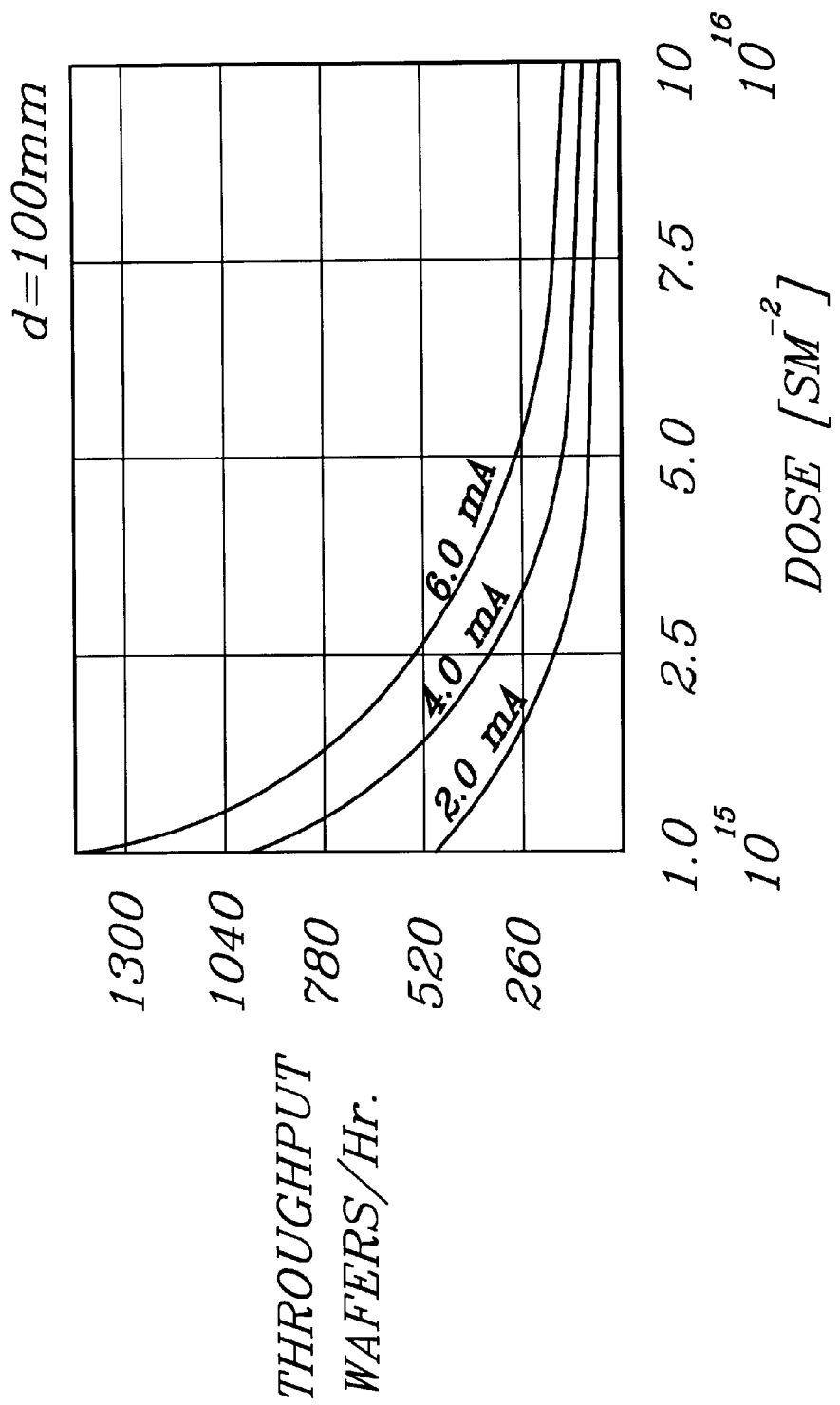
Figure 7C:
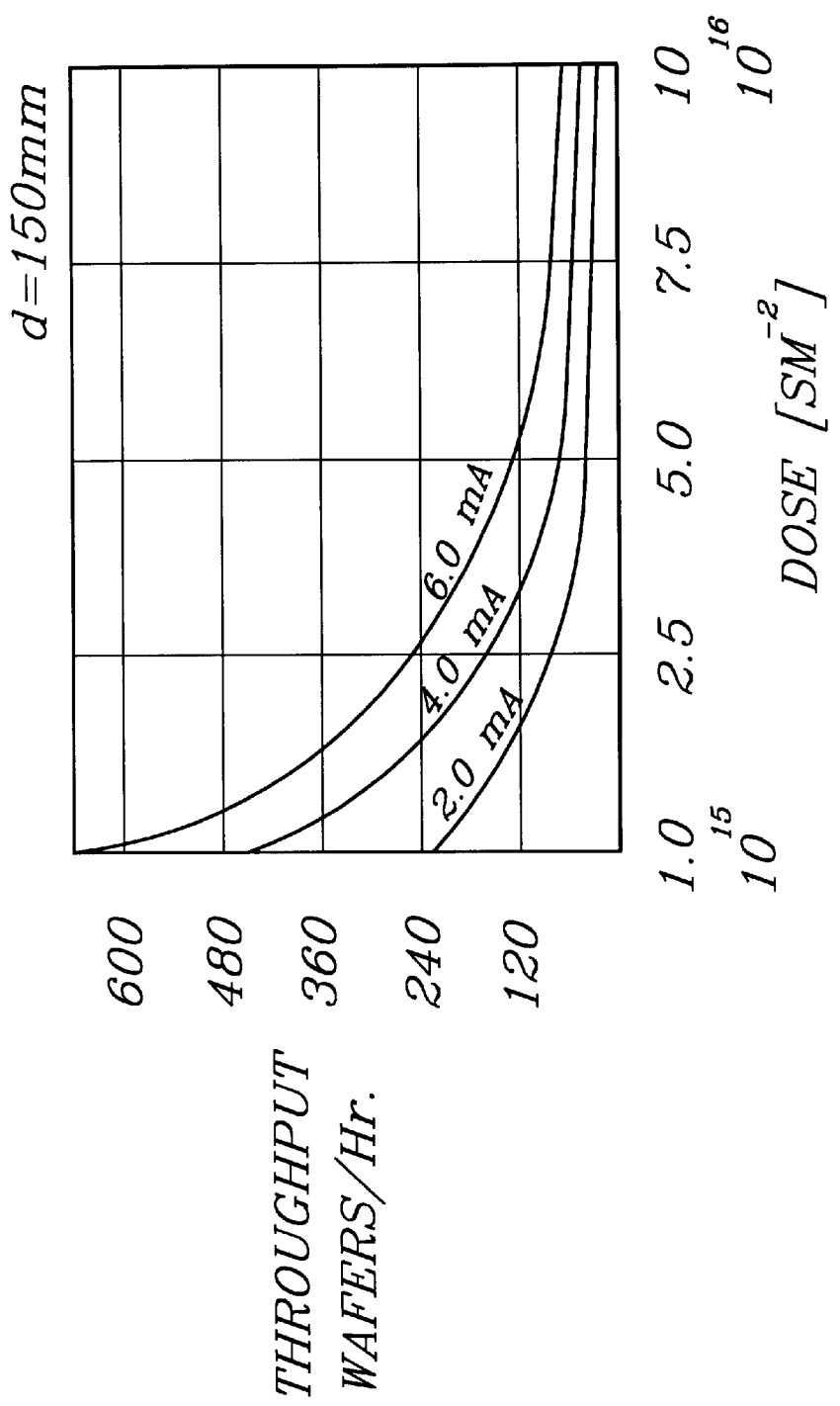
Figure 7D:
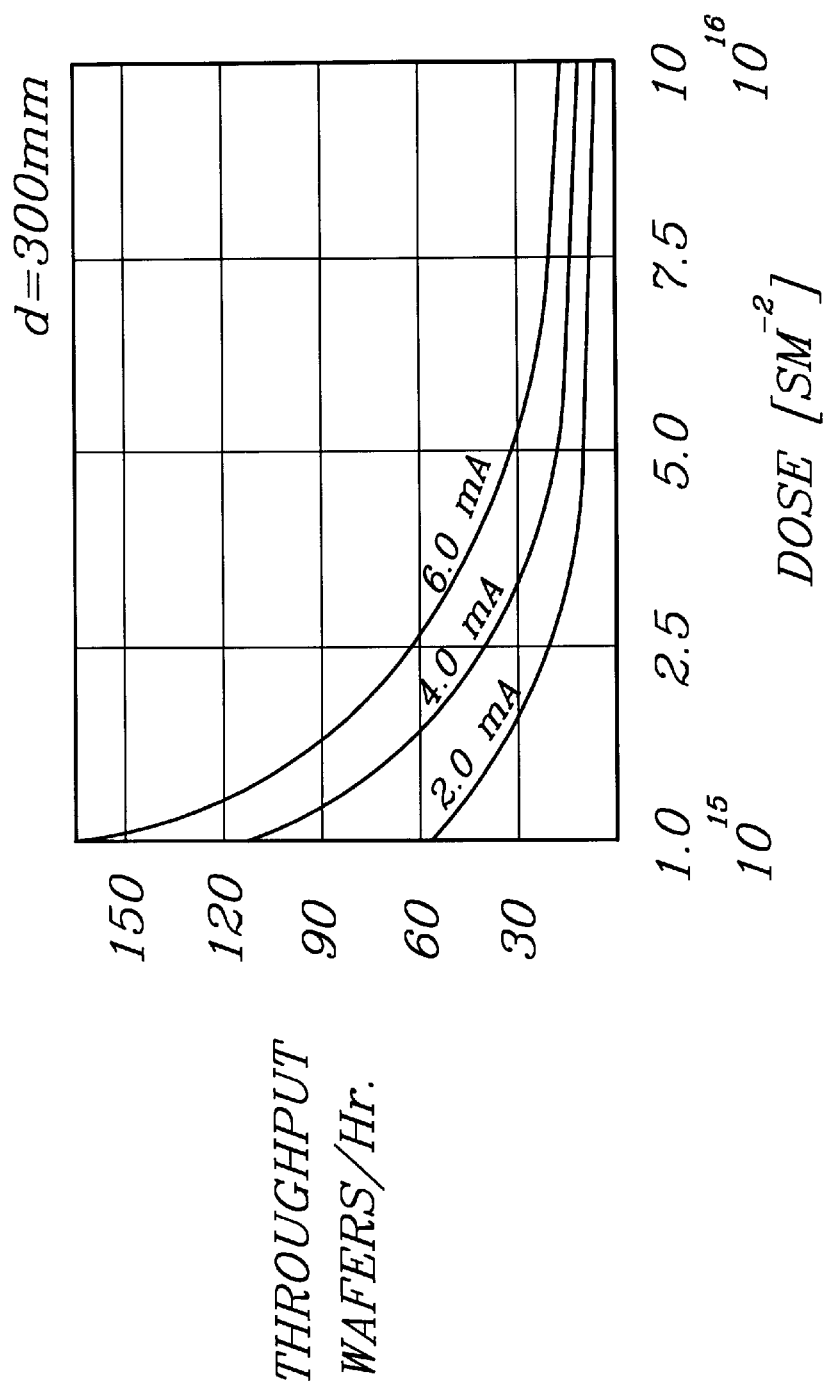

FIGS. 7A–7D are graphs of the throughput capability of the target presentation unit showing the high throughout capacity of the present invention for wafers having diameters of 50 mm in FIG. 7A, 100 mm in FIG. 7B, 150 mm in FIG. 7C, and 300 mm in FIG. 7D.

FIGS. 7A–7D show the dependency of throughput (wafers per hour) on ion dosage (number of ions per unit area) and ion beam current magnitude (milliamperes). It can be seen from FIGS. 7A–7D, that throughput increases with decreasing ion dosage and increasing ion beam current magnitude.

Figure 8:
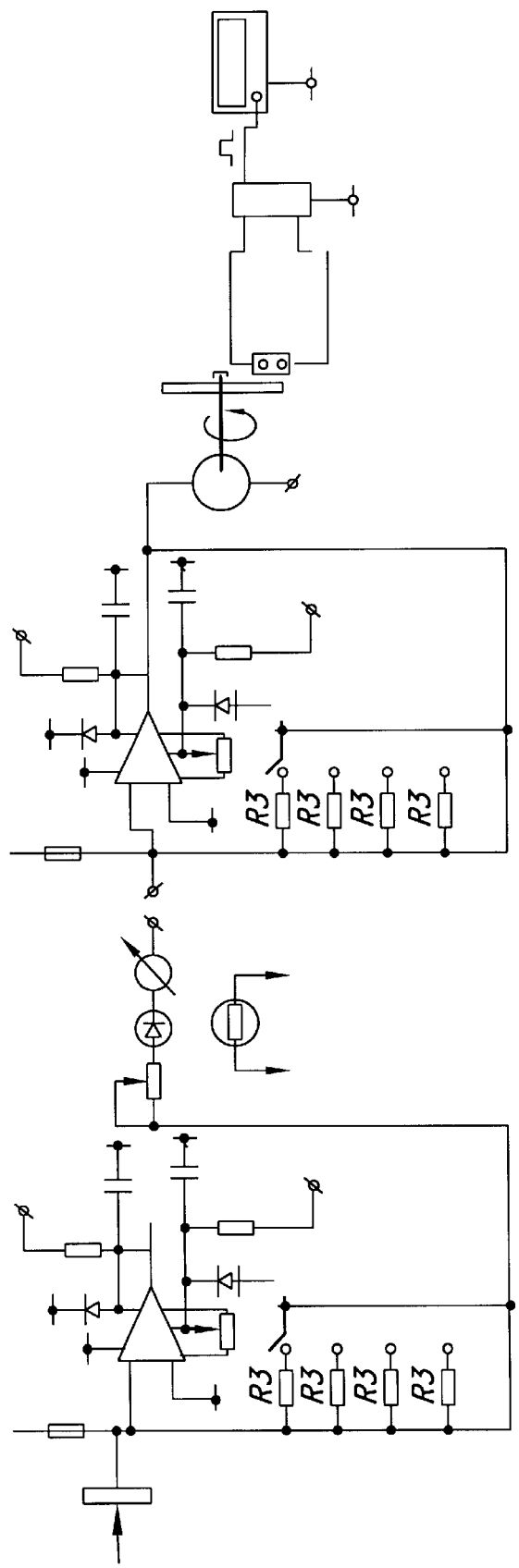
FIG. 8 is a diagram of a circuit that is used to measure the ion beam current that is used to process the wafers in the target presentation unit.

FIG. 8 is a circuit diagram of the circuit used to measure the magnitude of the ion beam current. The circuit depicted in FIG. 8 is a commonly used current integrator for measuring the amplitude of an ion beam current, and therefore is not further described.

Figure 9:
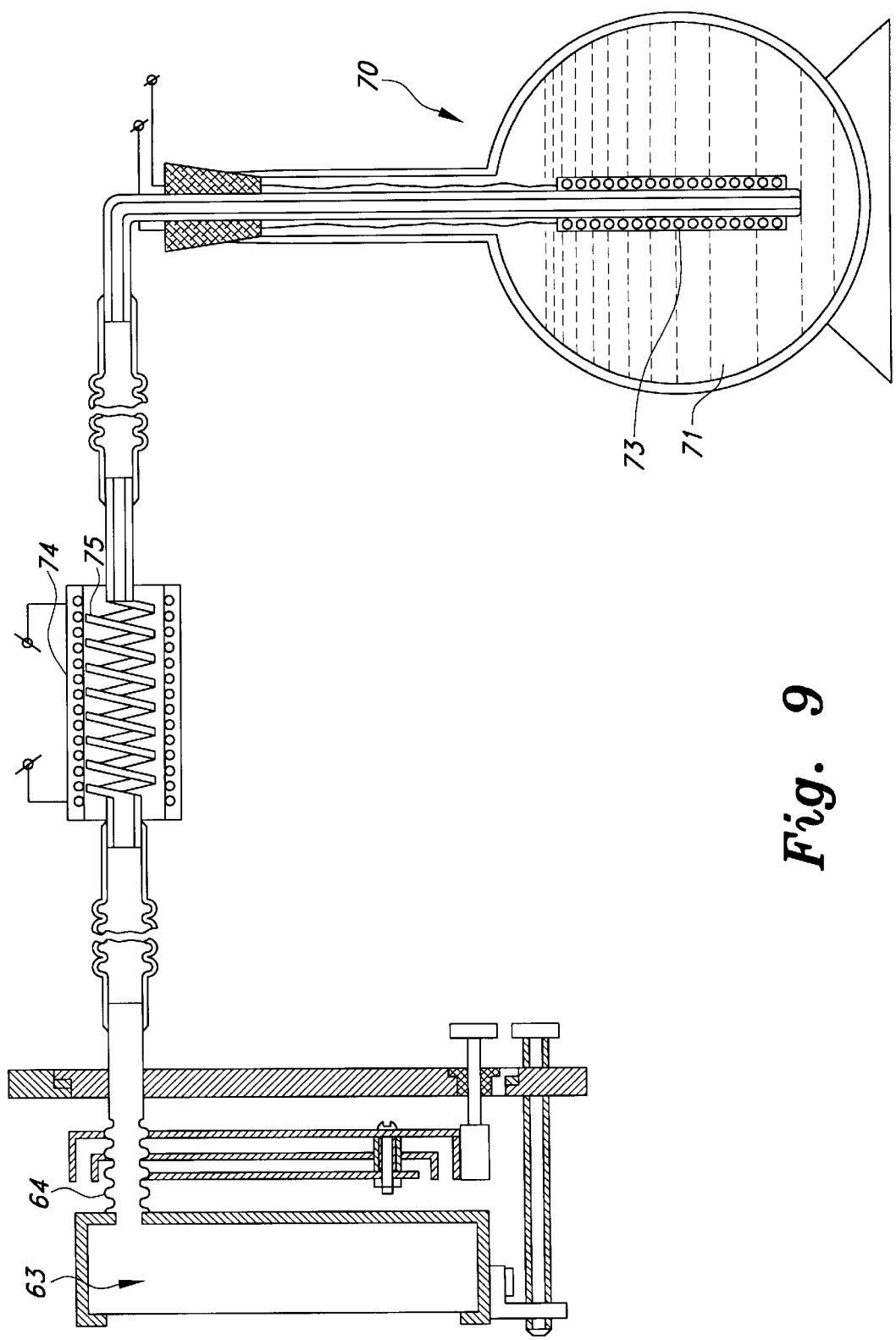
FIG. 9 is a side sectional view of an alternate embodiment of the target presentation unit.

FIG. 9 is an alternate embodiment of the present invention wherein the cooling means 31 of the target presentation unit 1 is connected to a vessel 70 containing liquid nitrogen 71. This embodiment is applicable for the formation of thin films that require extremely low deposition temperatures, for example, −196 degrees celsius. Using the embodiment depicted in FIG. 9, temperatures ranging from −196.4° C. up to 10° C. can be obtained. The temperature of the nitrogen vapors that enter the cooling unit 31 is determined by a nichrome heater 73 inside the Dewar flask 70 holding the liquid nitrogen 71 and a heater 74 that heats a coiled portion of the copper tubing 75 that connects the cooling unit 31 to the Dewar flask 70. When only the submerged heater 73 in the Dewar flask 70 is used, the temperature of the nitrogen vapor entering the cooling unit 31 is −196° C. When the second heater 74 outside the Dewar flask 70 is used the temperature of the nitrogen vapor entering the cooling unit 31 is increased.

Referring to FIG. 5, the semiconductor wafer 10 is attached to the center of the square body 76 of the cassette 18. The cassette 18 has a slightly elongated rectangular head 53 with a tapered neck 77 connecting the head 53 of the cassette 18 to the body 76 of the cassette 18. The metallic cassettes 18 are either chrome or nickel plated, however, in three specific locations (78,79,80), a graphite covering has been added to the cassettes 18 to reduce friction between the cassettes 18 and both the runners (29,30) of the central processing chamber 8 and the helices (81,82) of the screw conveyors (19,22,35,36).

The semiconductor wafers 10 are affixed to the cassettes 18 using any suitable adhesive, however, in the preferred embodiment, a silver paste is used. The silver paste has a high heat conductivity, therefore, the silver paste not only serves to adhere the wafer 10 to the cassette 18, but the silver paste also functions in rapidly removing the implantation generated heat from the wafer 10. The cassettes 18 move through the target presentation unit 1 in a counterclockwise direction with every ninety degree change of direction of the cassettes 18 that occurs being to the left.

The electrode system 59 of the target presentation unit 1 is used to produce a pure current of positive charged ions impacting the wafer 10 target by functioning as a barrier to electrons. The electrode system 59 is earth ground through the current integrator circuitry and has a negative bias in the range of 300–400V. The electrons accompanying the positive ions of the beam are repelled away from the target wafer 10 by the negatively biased electrodes 59.

The target presentation unit 1 of the present invention has a thermal shielding system (68,69) comprising multiple sets of thermal shields (68,69). One set of thermal shields 68 is disposed above the graphite heater 60 of the central processing chamber 8 while the other set of thermal shields 69 is disposed beneath the graphite heater 60. The thermal shielding system (68,69) serves to confine the heat radiating from the graphite heater 60 to the region of the central processing chamber 8 adjacent the wafer 10 bearing cassettes 18.

The docking mechanism 21 of the target presentation unit 1 comprises a pair of pliable coiled shafts (83,84,85,86), shown in FIG. 4, that extend along the lateral interior of the helical screw conveyor (19,36). The screw conveyors (19, 36) of the posterior sections (16,17) of the lateral chambers (11,12) are docked with the screw conveyors (22,35) of the anterior sections (14,15) by uncoiling the pliable coiled shaft (83,84,85,86) which advances the posterior section screw conveyor (19,36) until the posterior section screw conveyor (19,36) engages the anterior section screw conveyor (22,35). The posterior (19,36) and anterior (22,35) screw conveyors are undocked by recoiling the pliable coiled shaft (83,84, 85,86) which disengages and withdraws the posterior section screw conveyor (19,36).

The conveyor system of the target presentation unit 1 is fully automated. The rotation of the screw conveyors (19, 22,35,36) is achieved using stepping motors (40,41) while the continuous motion of the looped chain conveyor 28 is accomplished using linear motors (42,43). Both the stepping motors (40,41) of the screw conveyors (19,22,35,36) and the linear motors (42,43) of the looped chain conveyor 28 are control by optoelectronic sensors (44,45) and servomechanisms which include light emitting diodes (44,45) and the corresponding control circuitry. Light emitting diodes (44, 45) that emit visible light, ultraviolet light, or infrared light can be used; however, in the preferred embodiment, light emitting diodes (44,45) using infrared light are used because infrared light emitting diodes (44,45) are less expensive and more effective than the shorter wavelength visible and ultraviolet LEDs.

The light emitting diodes (44,45) sense when a cassette 18 enters the processing chamber 8 and when a cassette 18 leaves the processing chamber 8, therefore, the rate at which the wafers 10 on the cassettes 18 are processed is regulated by controlling the speed of the screw conveyors (19,22,35, 36). The angle of implantation is varied by the rotation of the target presentation unit 1. A pair of vertical bearings (47,87) permit rotation about the vertical axis while a pair of horizontal bearings (48,88) permit rotation about the horizontal axis. The rotation of the target presentation unit 1 is accomplished using a goniometer.

The present invention makes it possible to carry out ion beam processing over a wide temperature interval ranging from −200° C. up to 1000° C. The spiral graphite heater of the present invention makes it possible to carry out both the high temperature ion synthesis of various chemical compounds and the growth of very pure thin films from mass-separated, low energy ions. Using the target presentation unit of the present invention, high quality diamond thin films can be grown on silicon substrates from mass-separated, low energy carbon ions at temperatures ranging from 400–500° C.

These high quality diamond thin films are used in the manufacture of flat screen video devices, for example, television sets, computer monitors. Furthermore, the spiral graphite heater makes it possible to grow laminated superlattice structures comprising growing alternating layers of silicon and germanium using mass-selected, low energy ions. The silicon layer with a thickness of 1000 angstroms is grown at a temperature of 800° C. and the germanium layer is grown at a temperature of 600° C. These laminated superlattice structures form the basis for quantum well devices. During the growth of these thin films, the cooler is removed and the second spiral graphite heater with its thermal shields is mounted where the cooler was located. The second spiral graphite heater is used to increase the processing temperature beyond the temperatures reached using only the spiral graphite heater disposed in front of the cassettes with wafer.

For ion beam processing requiring the use of low temperatures, the spiral graphite heater disposed in front of the cassette with wafer is not used. Low temperature processing (−196° C. to 4° C.) is required in the amorphization of silicon wafers using silicon ions, in the synthesis of superconducting films by ion bombardment, and in the implantation of boron ions which are fundamental to the fabrication of integrated circuits. The rapid removal of heat away from the semiconductor wafer is crucial because during the fabrication of photovoltaic devices, the surface of a semiconductor wafer is covered by a photoconductive cell and the temperature of the wafer during implantation must not exceed 100° C.

Figure 10:
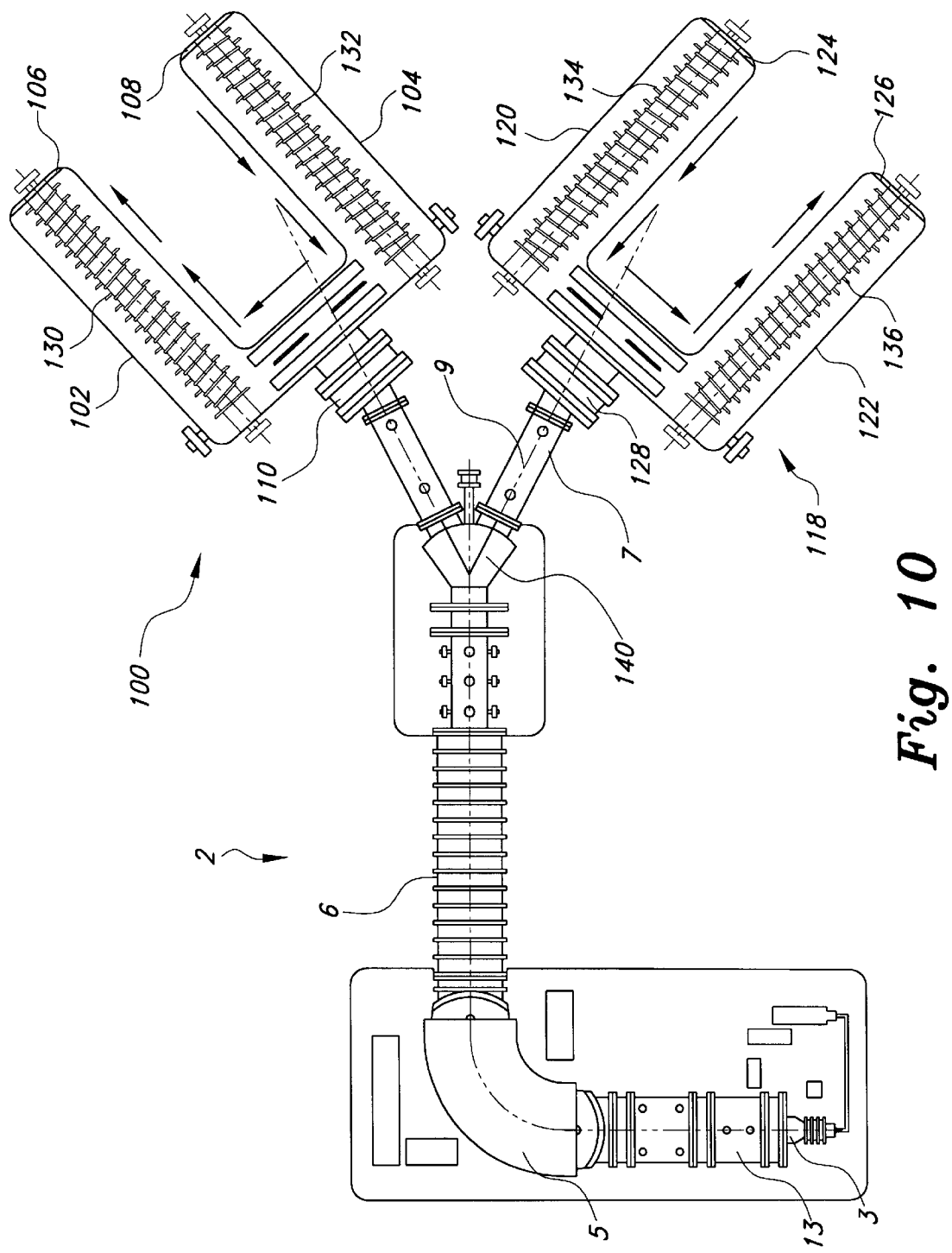
FIG. 10 is a diagrammatic, top view of an alternate embodiment of the target presentation unit.

FIG. 10 shows a second preferred embodiment of the target presentation unit (100,118) of the present invention. The second preferred embodiment employs two target presentation units (100,118) as depicted in FIG. 10. A switching magnet 140 switches the ion beam 9 to whichever target presentation unit (100,118) is in operation. In this embodiment, the loading chamber (104,120) and the discharge chamber (102,122) of the target presentation unit (100,118) is not partitioned into anterior and posterior sections.

Continuous processing is achieved by loading both target presentation units (100,118) with cassettes bearing substrates (132,134) to be processed. In a preferred embodiment, the substrates 10 are semiconductor wafers 10. In the embodiment depicted in FIG. 10, a plurality of cassettes with substrates (132,134) is loaded into the loading chamber (104,120) of each target presentation unit (100,118) through the loading chamber door (108,124) and both target presentation units (100,118) are evacuated after the loading chamber door (108,124) is closed. Processing begins in the first target presentation unit 100 and when processing is completed, the anterior chamber door 110 of the first target presentation unit 100 is closed and the vacuum in the first target presentation unit 100 is broken. The plurality of cassettes with processed substrates 130 is unloaded from the discharge chamber 102 of the first target presentation unit 100 through the discharge chamber door 106.

At the same time the anterior door 110 of the first target presentation unit 100 is closed, the anterior door 128 of the second target presentation unit 118 is opened and processing of the plurality of cassettes with substrates 134 in the second target presentation unit 118 is begun. After the plurality of cassettes with processed substrates 130 is unloaded from the first target presentation unit 100, a plurality of cassettes with substrates 132 to be processed is loaded into the loading chamber 104 of the first target presentation unit 100 and the first target presentation unit 100 is evacuated.

When the plurality of cassettes with substrates 136 has been processed in the second target presentation unit 118, the anterior chamber door 128 of the second target presentation unit 118 is closed and the anterior chamber door 110 of the first target presentation unit 100 is opened. As the plurality of cassettes with substrates 132 in the first target presentation unit 100 are processed, the plurality of cassettes with processed substrates 136 in the second target presentation unit 118 are unloaded and a plurality of cassettes with substrates 134 to be processed are loaded into the second target presentation unit 118.

Therefore, continuous processing of cassettes with substrates (132,134) is achieved by alternating between target presentation units (100,118) so that at least one of the two target presentation units (100,118) is always in operation.

The target presentation unit of the present invention provides continuous high throughput processing of semiconductor wafers with a single vacuum pumpdown of the processing chamber. The continuous processing method of the present invention provides an efficient, low cost method for processing semiconductor wafers.

The preferred embodiments of the present invention disclosed herein are intended to be illustrative only and are not intended to limit the scope of the invention. It should be understood by those skilled in the art that various modifications and adaptations as well as alternative embodiments may be contemplated. It is to be understood that the present invention is not limited to the embodiments described above, but encompasses any and all embodiments within the scope of the following claims.

I claim:

1. An apparatus for implanting ions into semiconductor wafers, said apparatus comprising:

an ion implantation unit for producing an ion beam;

a substantially tubular, U-shaped target presentation unit for conveying and positioning of the semiconductor wafers to the ion beam produced by said ion implantation unit, said target presentation unit including:

a lateral loading chamber, a central vacuum processing chamber having a window for entry of the ion beam, and a lateral discharge chamber, said loading chamber and said discharge chamber each being partitioned into an anterior section and a posterior section;

a first screw conveyor removably containing a plurality of cassettes disposed in the posterior section of said loading chamber, each of said cassettes having a semiconductor wafer vertically mounted therein;

a second screw conveyor disposed in the anterior section of said loading chamber;

a first door disposed at a terminal end of the posterior section of said loading chamber, and a second door positioned between the posterior section and the anterior section of said loading chamber;

means for docking said first screw conveyer with said second screw conveyer to sequentially transfer the plurality of cassettes from the posterior section to anterior section of said loading chamber;

a looped chain conveyor disposed in said central processing chamber for vertically transporting in sequence each of said cassettes from the anterior section of said loading chamber across the ion beam to obtain a plurality of processed semiconductor wafers;

a third screw conveyor disposed in the anterior section of said discharge chamber for sequentially receiving the plurality of cassettes containing the processed semiconductor wafers;

a fourth screw conveyor disposed in the posterior section of said discharge chamber;

a third door disposed at a terminal end of the posterior section of said discharge chamber, and a fourth door positioned between the anterior section and the posterior section of said discharge chamber;

means for docking said fourth screw conveyer with said third screw conveyer to sequentially transfer the plurality of cassettes containing the processed semiconductor wafers from the anterior section to the posterior section of said discharge chamber;

motor means for driving said chain conveyor and each said screw conveyor;

heating means disposed within said central processing chamber for heating the plurality of semiconductor wafers;

replaceable cooling means disposed within said central processing chamber for cooling the plurality of semiconductor wafers;

sensing means disposed within said loading chamber, said central processing chamber and said discharge chamber for regulating and controlling the movements of each said screw conveyor and said chain conveyor;

means for adjusting the angle of the ion beam entering said central processing chamber; and means for measuring the amplitude of the ion beam.

2. The apparatus according to claim 1, wherein said heating means is a first spiral graphite heater.

3. The apparatus according to claim 1, wherein said sensing means comprises a light emitting diode.

4. The apparatus according to claim 1, further including a plurality of negatively biased electrodes disposed in the central processing chamber for repelling electrons accompanying the ion beam away from the semiconductor wafer.

5. The apparatus according to claim 1 wherein said measuring means comprises a Faraday cup.

6. The apparatus according to claim 1, wherein said replaceable cooling means is replaced by a second spiral graphite heater for further heating said the plurality of semiconductor wafers.

7. The apparatus according to claim 1, wherein said replaceable cooling means includes copper plates in direct contact with the rear surface of each of said cassettes, said copper plates being cooled by a remote source of a cooling agent.

8. The apparatus according to claim 7, wherein said cooling agent is a source of liquid nitrogen.

9. An apparatus for conveying and positioning of semiconductor wafers to an ion beam produced by an ion implantation unit, said apparatus comprising:

a substantially tubular, U-shaped target presentation unit including:

a lateral loading chamber, a central vacuum processing chamber having a window for entry of the ion beam, and a lateral discharge chamber, said loading chamber and said discharge chamber each being partitioned into an anterior section and a posterior section;

a first screw conveyor removably containing a plurality of cassettes disposed in the posterior section of said loading chamber, each of said cassettes having a semiconductor wafer vertically mounted therein;

a second screw conveyor disposed in the anterior section of said loading chamber;

a first door disposed at a terminal end of the posterior section of said loading chamber, and a second door positioned between the posterior section and the anterior section of said loading chamber;

means for docking said first screw conveyer with said second screw conveyer to sequentially transfer the plurality of cassettes from the posterior section to anterior section of said loading chamber;

a looped chain conveyor disposed in said central processing chamber for vertically transporting in sequence each of said cassettes from the anterior section of said loading chamber across the ion beam to obtain a plurality of processed semiconductor wafers;

a third screw conveyor disposed in the anterior section of said discharge chamber for sequentially receiving the plurality of cassettes containing the processed semiconductor wafers;

a fourth screw conveyor disposed in the posterior section of said discharge chamber;

a third door disposed at a terminal end of the posterior section of said discharge chamber, and a fourth door positioned between the anterior section and the posterior section of said discharge chamber;

means for docking said fourth screw conveyer with said third screw conveyer to sequentially transfer the plurality of cassettes containing the processed semiconductor wafers from the anterior section to the posterior section of said discharge chamber;

motor means for driving said chain conveyor and each said screw conveyor;

heating means disposed within said central processing chamber for heating the plurality of semiconductor wafers;

replaceable cooling means disposed within said central processing chamber for cooling the plurality of semiconductor wafers;

sensing means disposed within said loading chamber, said central processing chamber and said discharge chamber for regulating and controlling the movements of each said screw conveyor and said chain conveyor;

means for adjusting the angle of the ion beam entering said central processing chamber; and means for measuring the amplitude of the ion beam.

10. The apparatus according to claim 9, wherein said heating means is a first spiral graphite heater.

11. The apparatus according to claim 9, wherein said sensing means comprises a light emitting diode.

12. The apparatus according to claim 9, further including a plurality of negatively biased electrodes disposed in the central processing chamber for repelling electrons accompanying the ion beam away from the semiconductor wafer.

13. The apparatus according to claim 9 wherein said measuring means comprises a Faraday cup.

14. The apparatus according to claim 9, wherein said replaceable cooling means is replaced by a second spiral graphite heater for further heating said the plurality of semiconductor wafers.

15. The apparatus according to claim 9, wherein said replaceable cooling means includes copper plates in direct contact with the rear surface of each of said cassettes, said copper plates being cooled by a remote source of a cooling agent.

16. The apparatus according to claim 15, wherein said cooling agent is a source of liquid nitrogen.

* * * * *